United States Patent [19]

Okawa

[11] Patent Number: 5,759,874
[45] Date of Patent: Jun. 2, 1998

[54] METHOD FOR PRODUCING SEMICONDUCTOR ELEMENT AND ADHESIVE SHEET FOR ADHERING WAFER

[75] Inventor: Yuji Okawa, Ibaraki, Japan

[73] Assignee: Nitto Denko Corporation, Osaka, Japan

[21] Appl. No.: 486,584

[22] Filed: Jun. 7, 1995

Related U.S. Application Data

[63] Continuation-in-part of PCT/JP94/01858, Nov. 4, 1994.

[30] Foreign Application Priority Data

| Nov. 4, 1993 | [JP] | Japan | 5-275711 |
| Dec. 1, 1993 | [JP] | Japan | 5-302052 |
| Dec. 1, 1993 | [JP] | Japan | 5-302065 |

[51] Int. Cl.$^6$ ............................................. H01L 21/60
[52] U.S. Cl. .................................... 438/124; 438/126
[58] Field of Search ............................... 437/206, 209, 437/211, 214, 215, 217, 218, 219, 220; 438/121, 122, 123, 124, 125, 126

[56] References Cited

U.S. PATENT DOCUMENTS

| 4,908,086 | 3/1990 | Goodrich et al. | 437/210 |
| 5,225,023 | 7/1993 | Wojnarowski et al. | 437/209 |
| 5,286,679 | 2/1994 | Farnworth et al. | 437/214 |
| 5,348,607 | 9/1994 | Wojnarowski et al. | 437/211 |
| 5,418,189 | 5/1995 | Heinen | 437/209 |
| 5,434,106 | 7/1995 | Lim et al. | 437/209 |
| 5,554,569 | 9/1996 | Ganesan et al. | 437/209 |

*Primary Examiner*—Kevin Picardat
*Attorney, Agent, or Firm*—Sughrue, Mion, Zinn, Macpeak & Seas, PLLC

[57] ABSTRACT

A method for producing a semiconductor element, comprising treating a lead frame or a semiconductor wafer or a semiconductor chip, or a lead frame and a semiconductor chip in combination, with at least one package crack-preventing compound selected from compounds having a reactive group, acids, derivatives at a group due to which said acid assumes acidity, siloxane derivatives of the formula (I)

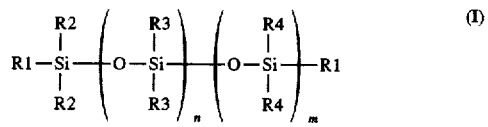

and compounds having a number average molecular weight of not more than 10,000 and comprising, in their structure, said siloxane derivative; and an adhesive for adhering a wafer, which is usable in said production method. According to the method, package cracks can be significantly prevented.

6 Claims, 4 Drawing Sheets

METHOD FOR PRODUCING SEMICONDUCTOR ELEMENT AND ADHESIVE SHEET FOR ADHERING WAFER

This is a continuation-in-part application of PCT/JP94/01858 filed Nov. 4, 1994, which is pending.

TECHNICAL FIELD

The present invention relates to a method for producing a semiconductor element. More particularly, the present invention relates to a method causing less occurrence of package cracks, which is an improvement of a method for producing a resin-sealed semiconductor element, comprising sealing, with a sealant resin, a semiconductor chip connected with a lead frame. The present invention also relates to a pressure sensitive adhesive sheet for adhering a wafer, which is usable for said method.

BACKGROUND ART

Conventional resin-sealed type semiconductor packages (semiconductor elements) have a structure wherein a semiconductor chip cut and separated from a semiconductor wafer is bonded to a die pad integrally formed with a lead frame, by an adhering means such as a silver paste. However, conventional semiconductor package structures have had difficulty in meeting the requirements of the chips which are becoming bulkier in recent years, such as DRAM, and an increasing number of an LOC structure, wherein a lead frame is formed on a chip, has been employed.

In the LOC structure, the back of the conductor chip directly contacts a sealant resin, unlike the conventional semiconductor package structures. In various structures including conventional semiconductor package structures, the die pad area is made smaller than the area of the semiconductor chip by forming an opening in the die pad and other methods. In such structures, the die pad area is smaller than that of the semiconductor chip, and the back of the semiconductor chip directly contacts, in part, the sealant resin.

A semiconductor wafer is adhered to a pressure sensitive adhesive sheet, diced into plural semiconductor chips (dicing), picked up from the adhesive sheet and bonded to a die pad. When the back (the surface in contact with adhesive sheet, hereinafter the same) of the semiconductor chip directly contacts the sealant resin, cracks are developed on the surface or inside of the sealant resin to cause so-called package cracks, which cracks being produced due to different coefficients of linear expansion of the materials of the sealant resin and the semiconductor chip, or the water pooled in the interface between the adhesive adhered to the back of the semiconductor chip and the sealant resin.

The front face (pattern-formed surface) of the semiconductor chip is generally applied with a polyimide resin and is free of package cracks. An application of a polyimide resin to the back of the semiconductor chip as well will add complicated steps and increase the production cost due to the use of an expensive polyimide resin.

A copper frame is increasingly used as a lead frame to seek an enhanced heat releasing effect. However, the copper frame is susceptible to package cracks in comparison with the conventional 42 alloy and is problematic.

The semiconductor sealant resin also faces increasing difficulty in providing both superior releasability from molding die and adhesion to semiconductor chips, as the size of the semiconductor chip becomes greater.

DISCLOSURE OF THE INVENTION

An object of the present invention is to resolve the problems associated with the prior art and to provide a method for producing a semiconductor element, which prevents package cracks without complicated steps and facilitates designing of the sealant resin.

Another object of the present invention is to provide a pressure sensitive adhesive sheet for adhering wafers which can be suitably used according to the above-mentioned production method.

That is, the method for producing the semiconductor element of the present invention is characterized in that the method comprises a step of treating a lead frame or a semiconductor wafer or a semiconductor chip, or a lead frame and a semiconductor chip in combination, with at least one package crack-preventing compound selected from the group consisting of compounds having a reactive group (except the following acids and derivatives at a group due to which said acid assumes acidity), acids, derivatives at a group due to which said acid assumes acidity (hereinafter to be referred to as acid derivatives), which excludes, from among the acids and acid derivatives, those encompassed in the compounds of the following formula (I), siloxane derivatives of the formula (I)

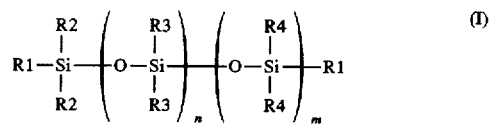

wherein R1, R2, R3 and R4 are the same or different and each is a monovalent organic group, n and m are each an integer of 0 or not less than 1, and the total of n and m is 1–1,000, and compounds having a number average molecular weight of not more than 10,000 and comprising, in their structure, said siloxane derivative.

The pressure sensitive adhesive sheet for adhering wafers, of the present invention, comprises a layer formed of an adhesive comprising the above-mentioned, at least one package crack-preventing compound, which is laminated on a substrate.

Figure 1:
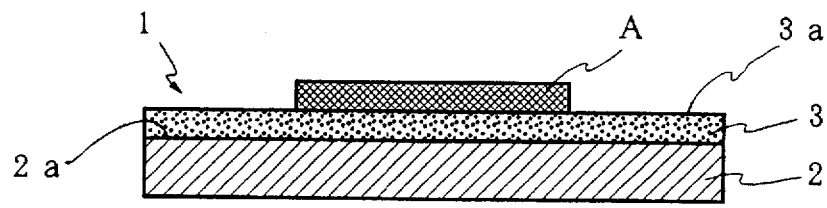
FIG. 1 is a cross sectional view showing one embodiment of the pressure sensitive adhesive sheet for adhering a wafer, of the present invention.

In the present invention, the "organic compound having a reactive group" means compounds having hydroxy, amino, carbonyl (epoxy inclusive), nitro, nitroso, unsaturated hydrocarbon (e.g. alkenyl, alkadienyl, alkatrienyl and alkynyl), isocyanate group and the like, and is exemplified by crosslinking agents (e.g. isocyanate crosslinking agent, epoxy crosslinking agent and melamine crosslinking agent), and silane coupling agents (e.g. isocyanate, modified isocyanate, modified aminosilane, titanate, epoxy functional silane, olefin silane, acrylic silane, mercapto silane, isocyanate silane, epoxy silane, amino silane, silane having carboxyl group and derivatives at the carboxyl group). Preferred "organic compound having a reactive group" is exemplified by a hydroxy-reactive "organic compound having a reactive group", particularly, such compound having a molecular weight of not more than 1,000. Specific examples of the "organic compound having a reactive group" include the following compounds.

Crosslinking agents:

Melamine crosslinking agents such as SUPER BECKAMINE J-820 N-60 of the following formula

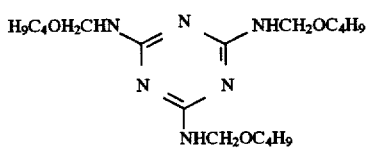

Epoxy crosslinking agents such as TETRAD-C of the following formula and the compounds of the following formulas

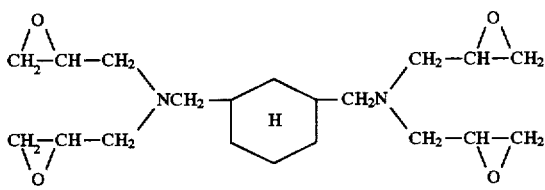

Isocyanate crosslinking agents such as CORONATE L of the following formula

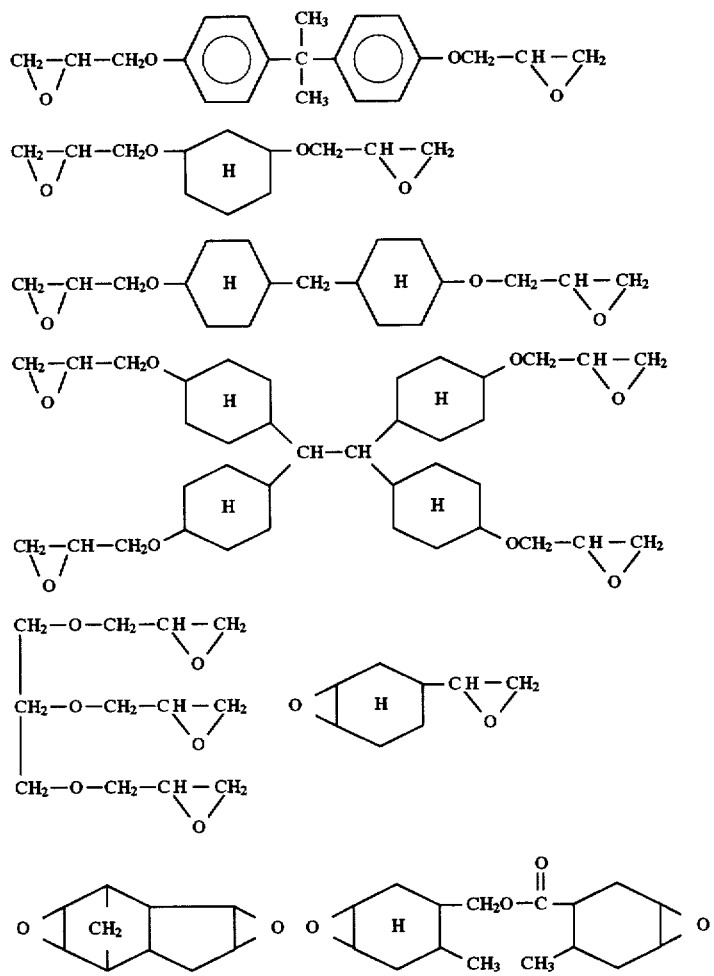

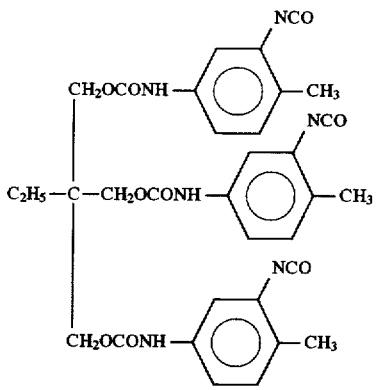

dimethyl-diphenylmethane diisocyanate, dimethoxydiphenyl diisocyanate, dimethoxy-biphenylene diisocyanate and tetramethyl-biphenylene diisocyanate Silane coupling agents:

Silicone silane coupling agents such as 3-aminopropyltriethoxy silane, 3-methacryloxypropyltrimethoxy silane, 2-(3,4-epoxycyclohexyl)ethyltrimethoxy silane, N-2-(aminoethyl)-3-aminopropylmethyldimethoxy silane, N-2-(aminoethyl)-3-aminopropylmethyldimethoxy silane, N-phenyl-3-aminopropyltrimethoxy silane, 3-mercaptopropyltrimethoxy silane, anilinopropyltrimethoxy silane, mercaptopropylmethyldimethoxy silane, 3-ureidopropyltrimethoxy silane, 3-aminopropyl-tris(2-methoxyethoxy-ethoxy)silane, N-methyl-3-aminopropyltrimethoxy silane, 3-4,5-dihydroimidazolepropyltriethoxy silane, and KBM-403, KBM-903, KBM-902, KBM-603 and KBP-44 of the following formulas.

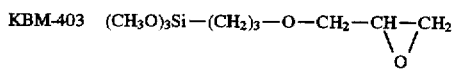

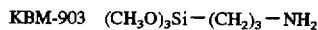

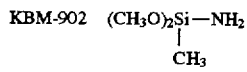

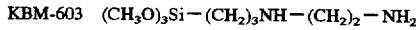

Examples of the acid include inorganic acids such as sulfuric acid, nitric acid and phosphoric acid, and organic acids having carboxyl or sulfone. Acid derivatives are derivatives at groups (e.g. carboxyl and sulfone), due to which said acid assumes acidity, such as ester, amide and anhydride.

Examples of the organic acid and organic acid derivative include aromatic dicarboxylic acids such as phthalic acid; aromatic dicarboxylic acid derivatives such as phthalic acid amide; aromatic monocarboxylic acids such as benzoic acid; aromatic carboxylic acids having other substituents, such as alkylbenzoic acid and aminobenzoic acid; aliphatic monocarboxylic acids such as acetic acid; aliphatic dicarboxylic acids such as succinic acid, adipic acid and maleic acid; unsaturated carboxylic acids such as crotonic acid, tetrolic acid, acrylic acid and methacrylic acid; aliphatic carboxylic acid compounds having other substituents as well, such as amino; aliphatic or aromatic carboxylic acid compounds having three or more carboxyl groups; acid anhydrides of the above mentioned, such as mixed acid anhydride or ester with other acid such as acetic acid; oligomers comprising the above-mentioned acid and/or acid derivative as a part of the constituting element thereof (with preference given to those comprising the above-mentioned acid and/or acid derivative at a ratio of 10% or more by mole per the copolymer, in view of the effectiveness thereof); and compounds wherein the above-mentioned carboxyl is substituted by sulfone. Examples of the compounds substituted by sulfone include lower alkylsulfonic acids such as methanesulfonic acid and ethanesulfonic acid, lower alkyldisulfonic acids such as ethanedisulfonic acid and propanedisulfonic acid, and arylsulfonic acid such as benzenesulfonic acid and toluenesulfonic acid, with particular preference given to inorganic acids such as phosphoric acid and acid anhydrides such as phthalic anhydride and maleic anhydride.

Examples of the acid derivative include, from among the compounds exemplified as radiation polymerizable compounds in the description to follow, the compounds exemplified as acrylate compounds.

In addition, salts are also encompassed in the above-mentioned acid derivatives, which are exemplified by alkali metal salts and alkaline earth metal salts, such as potassium salt and calcium salt; halogenated hydrates such as hydrofluoride, hydrochloride, hydrobromide and hydroiodide; inorganic acid salts such as nitrate, perchlorate, sulfate and phosphate; lower alkylsulfonates such as methanesulfonate, trifluoromethanesulfonate and ethanesulfonate; arylsulfonates such as benzenesulfonate and p-toluenesulfonate; organic acid salts such as fumarate, succinate, citrate, tartrate, oxalate and maleate; and amino acid salts such as glutamate and aspartate.

It is preferable that, when the above-mentioned acid and acid derivative are oligomers or polymers, the group due to which said acid assumes acidity is 5/100 or more in number ratio relative to the number of units constituting the compound skeleton. The group due to which said acid assumes acidity here means carboxyl and sulfone, and in acid derivatives, it means the group due to which said acid assumes acidity before conversion into a derivative.

When a package crack-preventing compound, in particular, an acid or acid derivative is added to the adhesive of the sheet for adhering wafers in the present invention, for example, the acid moiety of the acid and/or acid derivative is substituted by a protecting group to prevent reaction with a crosslinking agent, and after dicing, the protecting group is eliminated by, for example, UV irradiation to convert same to the original acid, thus affording the effect of the present invention with less amounts. Examples of such compounds include diallylsulfonium salt, triallylsulfonium salt, dialkylphenacylsulfonium salt, allyldiazonium salt, aromatic tetracarboxylate, aromatic sulfonate, nitrobenzyl ester, aromatic sulfamide and naphthoquinonediazido-4-sulfonate. These compounds are also encompassed in the acid or acid derivative of the present invention.

The package crack-preventing compounds having a surfactant action are not preferable in the present invention.

The siloxane derivative in the present invention having the following formula (I)

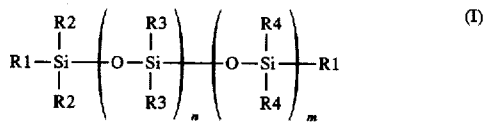

wherein R1, R2, R3 and R4 are the same or different and each is a monovalent organic group, n and m are each an integer of 0 or not less than 1, and the total of n and m is 1–1,000, encompasses a wide range of conventionally known compounds. The "monovalent organic group" here means, for example, amino, aminoalkyl having 1 to 10 carbon atoms, alkyl having 1 to 5 carbon atoms, alkoxy having 1 to 10 carbon atoms, phenyl, aminophenyl, carboxyl, carboxyalkyl having 1 to 10 carbon atoms and carboxyphenyl. The representative siloxane derivatives are as follows.

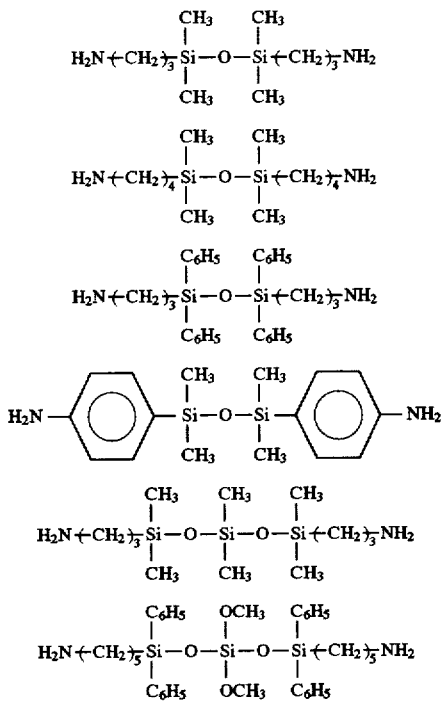

In addition, siloxane derivatives wherein, in the above-mentioned structural formulas, amino is substituted by carboxyl are exemplified.

Moreover, a compound having a number average molecular weight of not more than 10,000 and comprising the above-mentioned siloxane derivative as a part of its structure may be used, in which case the above-mentioned siloxane derivative is preferably contained in a proportion of not less than 5% by mole of the copolymer, more preferably not less than 20% by mole of the copolymer, in view of the effectiveness thereof. While the other components constituting said compound are not particularly limited, they are preferably soluble in a dilution medium to be used for preparing a solution containing said compound. "Comprising the siloxane derivative as a part of its structure" means that the derivative forms the skeleton or side chain of the material constituting the adhesive, such as adhesive polymers and radiation polymerizable compounds.

The organic compound having reactive group, acid, acid derivative, siloxane derivative of the formula (I) and the compound comprising the siloxane derivative, as mentioned above, may be respectively used alone or used in combination, or diluted with water or organic solvent, where necessary. While the concentration of the diluted solution containing the above-mentioned compound varies depending on the kind of the compound and solvent, it is generally 0.01% by weight-30% by weight, preferably 0.05% by weight-10% by weight.

In the production method for the semiconductor element of the present invention, a lead frame or a semiconductor wafer or a semiconductor chip, or a lead frame and a semiconductor chip in combination treated, before sealing the semiconductor chip connected with a lead frame with a sealant resin, with at least one compound selected from the group consisting of the above-mentioned organic compound having reactive group, acid, acid derivative, siloxane derivative of the formula (I) and compound comprising the siloxane derivative as a part of their structure. The treatment of these semiconductor chip etc. may be performed at any stage as long as it is before sealing, and the above-mentioned compound or a dilute solution thereof is treated according to a method such as coating (e.g. spin coating), applying, spraying and transferring from a tape or a film (adhesive sheet for adhering wafer), thereby to adhere the package crack-preventing compound to these semiconductor chips etc., namely, to a semiconductor wafer before dicing, a semiconductor wafer after dicing (semiconductor chip) and the like. That is, the treatment in the present invention is adhering a package crack-preventing compound to the surface of a lead frame or a semiconductor wafer or a semiconductor chip, or a lead frame and a semiconductor chip in combination.

As has been explained in the above, the package cracks on the back of a semiconductor chip (the opposite surface from the pattern-formed surface) particularly poses problems, and the above-mentioned treatment at least on the back of the semiconductor chip is desirable. When the above-mentioned treatment is applied to a lead frame, it is desirably applied at least to the portion of the lead frame which is sealed with a sealant resin. The minimum thickness is not less than 0.005 µm, preferably not less than 0.001 µm, and more preferably not less than 0.03 µm. Such film thickness is particularly preferable when the treatment is applied to the entirety of the frame.

While the film thickness after the treatment with the above-mentioned compound or a dilute solution thereof varies depending on the kind of the compound and solution, it is generally not more than 1 µm, preferably not more than 0.1 µm.

In the present invention, the treatment is not necessarily done to the entirety of the surface to be treated, but the compound or solution may be adhered in spots. In this case, the C content, from among the Si, C and O elements to be detected by the surface analysis of the back of the semiconductor chip by ESCA, is desirably not less than 4% by weight, preferably not less than 5% by weight relative to the weight of the blank (untreated) semiconductor chip.

The pressure sensitive adhesive sheet for adhering wafer, which is used in the production method of the semiconductor element of the present invention, is described in the following. This sheet is used for the transfer treatment of the package crack-preventing compound to wafers.

FIG. 1 is a cross sectional view showing one embodiment of the adhesive sheet for adhering a wafer, of the present invention. A pressure sensitive adhesive sheet 1 for adhering a wafer (hereinafter abbreviated as adhesive sheet) in FIG. 1 is composed of a substrate 2 and an adhesive layer 3 laminated on one surface of the substrate 2, wherein the adhesive layer 3 contains a package crack-preventing compound. The adhesive sheet of the present invention can take any shape such as a tape, a label and the like.

As the substrate 2, those having superior water resistance and heat resistance are preferably used, with particular preference given to a synthetic resin film. When a radiation such as ultraviolet rays (UV) and electron beams (EB) is applied to the adhesive sheet of the present invention when in use, a material allowing penetration of such radiation in a necessary amount needs to be used.

Examples of the substrate 2 include polyethylene film, polypropylene film, ethylene-propylene copolymer film, polyvinyl chloride film, polyethylene terephthalate film, ethylene-vinyl acetate-film, polyurethane film, polybutylene terephthalate film, polymethylpentene film and polybutadiene film. When expanded after dicing a wafer, a stretchable film of polyvinyl chloride, polyolefin, polyolefin derivative or the like is preferably used. These films are used alone or upon laminating to give multiple layers.

For an improved anchor property of the adhesive, it is possible to subject a surface 2a of the substrate 2, which is to be applied with an adhesive, to a known treatment such as corona treatment, EB treatment and undercoating. The thickness of the film of the substrate 2 is generally 25 µm–300 µm, preferably 30 µm–300 µm and more preferably 40 µm–180 µm, from the aspects of strength and penetration of radiation. When the substrate is fully cut for dicing, the thickness of 70 µm–180 µm is preferable, considering maintenance of strength after cutting.

It is possible to form, on the side 3a of the adhesive layer 3, which is opposite from the substrate 2, a release liner treated with silicon or an untreated polyethylene, polypropylene or fluorine release liner where necessary.

As the adhesive mainly constituting the adhesive layer 3, conventionally known adhesives are used. Examples thereof include those obtained by adding crosslinking agents such as polyisocyanate compound, alkyl etherified melamine compound, epoxy compound and silane coupling agent to a base polymer such as rubber polymer (e.g. natural rubber and various synthetic rubbers) and acrylic copolymer of (meth)acrylic alkyl ester and other unsaturated monomer copolymerizable with this ester. The above-mentioned base polymer may have a carbon-carbon double bond which polymerizes in a molecule by radiation. In addition, the adhesive layer 3 may have a multiple layer structure of different components and ratios.

The package crack-preventing compound may be used alone or in combination as an adhesion-improving component, in an amount of 0.1–10 parts by weight, preferably 0.5–4 parts by weight relative to 100 parts by weight of the base polymer for those other than acid and acid derivative; in an amount of 0.1–150 parts by weight, preferably 0.1–100 parts by weight and more preferably 0.5–5 parts by weight relative to 100 parts by weight of the base polymer for acid and acid derivative. When an acid or acid derivative reacts in the crosslinking reaction or radiation curing reaction of the adhesive, the acid or acid derivative is preferably used in a larger amount than usual, so that the unreacted acid, acid derivative or an oligomer formed by the reaction of the acid or acid derivative with an adhesive may remain in the adhesive layer 3. When it is a radiation polymerizable compound, the amount is preferably in the range of from 30 to 100 parts by weight.

The package crack-preventing compound is added to the adhesive layer 3 by any method as long as it permits migration of the compound to the back of the wafer, such as by mixing when adding an adhesive to disperse the compound throughout the adhesive layer 3, by forming an adhesive layer containing a package crack-preventing compound on the surface of the adhesive layer, and by applying the compound on the surface of the adhesive layer.

When the adhesive is a radiation curable adhesive, a low molecular weight compound (hereinafter referred to as radiation polymerizable compound) having at least two carbon-carbon double bond in a molecule, is polymerized and cured by radiation to form a three-dimensional network and is added to the above-mentioned adhesive. When the curing means is UV, a photopolymerization initiator is preferably added.

The radiation polymerizable compound preferably has a molecular weight of about not more than 10,000. More preferably, the compound has a molecular weight of not more than 5,000 and has 2 to 6 radiation polymerizable carbon-carbon double bonds in a molecule, so that the formation of a three-dimensional network of the adhesive layer 3 by radiation can be done efficiently. Examples thereof include trimethylolpropane triacrylate, tetramethylolmethane triacrylate, tetramethylolmethane tetraacrylate, pentaerythritol triacrylate, pentaerythritol tetraacrylate, dipentaerythritol monohydroxypentaacrylate, dipentaerythritol hexaacrylate, 1,4-butylene glycol diacrylate, 1,6-hexanediol diacrylate, polyethylene glycol diacrylate, commercially available oligo ester acryalte, acrylate compounds such as the below-mentioned urethane acrylate oligomer, and organo-polysiloxane compositions such as those disclosed in Japanese Patent Publication No. 25907/1993 (particularly under Prior Art).

The urethane acrylate oligomer is a compound synthesized by a polyol compound, polyisocyanate, hydroxy(meth)acrylate and the like.

Examples of polyisocyanate include toluene diisocyanate, phenylene diisocyanate, hexamethylene diisocyanate, diphenylmethane diisocyanate, dimethyldiphenyl diisocyanate, dicyclohexylmethane diisocyanate and xylene diisocyanate.

Examples of polyol compound include ethylene glycol, propylene glycol, diethylene glycol, butanediol, pentanediol, trimethylolethane, trimethylolpropane and pentaerythritol.

Examples of hydroxy(meth)acrylate include 2-hydroxyethyl (meth)acrylate, polyethylene glycol (meth) acrylate and pentaerythritol triacrylate.

In the present invention, the radiation polymerizable compound is preferably an acrylate compound, in particular, pentaerythritol, with most preference given to dipentaerythritol hexaacrylate.

As the radiation polymerizable compound, one or more compounds as mentioned above may be used alone or in combination. The amount thereof is 1–120 parts by weight, preferably 1–100 parts by weight and more preferably 20–100 parts by weight relative to 100 parts by weight of the base polymer. When it is used in an amount of less than 1 part by weight, the formation of a three-dimensional network in the adhesive layer 3 by radiation becomes insufficient to result in too small a decrease in the adhesion of an adhesive sheet 1 to a chip. On the contrary, when it is used in an amount exceeding 120 parts by weight, the compatibility with the adhesive becomes poor to result in white cloud when prepared into a tape.

The above-mentioned photopolymerization initiator is exemplified by isopropylbenzoin ether, isobutylbenzoin ether, benzophenone, Michler's ketone, chlorothioxantone, dodecylthioxantone, dimethylthioxantone, acetophenone diethyl ketal, benzyl dimethyl ketal, α-hydroxycyclohexyl phenyl ketone and 2-hydroxymethylphenylpropane, which may be used alone or in combination.

The amount of the photopolymerization initiator is generally 0.1–10 parts by weight, preferably 0.1–5 parts by weight relative to 100 parts by weight of the above-mentioned base polymer. When it is used in an amount less than 0.1 part by weight, the formation of a three-dimensional network in the adhesive layer 3 by UV radiation becomes undesirably insufficient to result in too small a decrease in the adhesion of an adhesive sheet 1 to a chip. On the contrary, when it is used in an amount exceeding 10 parts by weight, the corresponding effect cannot be achieved. Moreover, the photopolymerization initiator undesirably remains in the back of the chip. Where necessary, an amine compound such as triethylamine, tetraethylpentamine and dimethylaminoethanol may be concurrently used with the photopolymerization initiator, to promote the photopolymerization.

Where necessary, tackifier, adhesion controlling agent, surfactant, other property-improving agents and conventionally-employed components may be used to control the adhesion of the wafer to be adhered. However, a less amount of a surfactant or a compound having a surfactant activity is more desirable for achieving the object of the present invention.

For forming an adhesive layer 3 using an adhesive composition comprising the respective ingredients mentioned above, for example, this composition is applied to a radiation penetratable substrate 2 and heated as necessary. The thickness of the adhesive layer 3 thus formed is generally 5 μm–40 μm, preferably 5 μm–25 μm.

A 90°-release adhesive strength between the adhesive layer 3 and a wafer A to be placed on the adhesive layer 3, of not more than 300 g/25 mm, preferably not more than 250 g/25 mm is desirable for easy pick up of the semiconductor chip from the adhesive sheet 1. The lower limit thereof is 15 g/25 mm, preferably 25 g/25 mm. When the adhesive sheet is a radiation curable one, the adhesive strength is desirably not more than 125 g/25 mm, preferably not more than 100 g/20 mm, with the lower limit set to 1 g/25 mm. The release adhesive strength is determined by cutting an adhesive sheet 1 in 25 mm wide pieces, adhering the sheet to the back of the wafer washed with toluene, leaving the sheet for 30 minutes and peeling the sheet at 300 mm/min to 90° under the conditions of 23° C. and relative humidity of 65%. When the adhesive sheet 1 is a radiation curable one, the release adhesive strength is determined after the adhesive strength has decreased by the irradiation of radiation from the substrate 2 side.

The separation method of the present invention, which includes the use of the adhesive sheet of the present invention, is explained in the following.

As shown in FIG. 1, a wafer A to be diced is placed on the adhesive layer 3 of the adhesive sheet 1, bonded with pressure and subjected to the steps of dicing, washing and drying.

Figure 2:
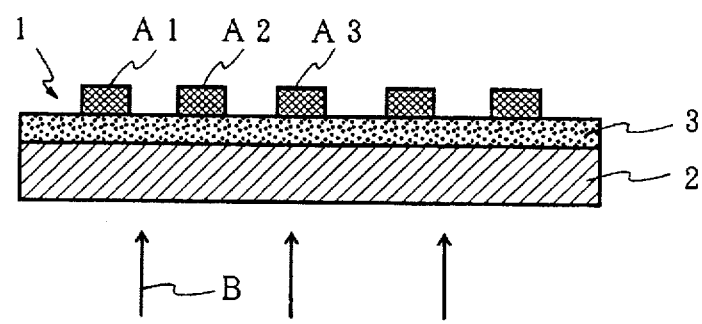
FIG. 2 explains a dicing step using the adhesive sheet for adhering a wafer, of the present invention.

Then, the adhesive layer 3 is irradiated with radiation B from the substrate 2 side of the adhesive sheet 1, as shown in FIG. 2, to lower the adhesive strength of the adhesive layer 3. In the method of the present invention, the method for irradiating radiation B and irradiating means are not particularly limited, and a conventional method employed in the technical fields of surface treatment, radiation curable coating and radiation curable adhesive is employed. Then, the adhesive sheet 1 is expanded and the distance between the respective semiconductor chips A1, A2, A3, . . . thus cut is made sufficient for picking up. The adhesive sheet 1 may be irradiated with Radiation B after expanding.

The irradiation of radiation B can be finished before complete curing of the adhesive layer 3, so that the transferred amount from the adhesive sheet can be increased. When the function to be achieved by the present invention is imparted to the radiation polymerizable polymer, the irradiation of radiation B is preferably finished before complete curing of the adhesive layer 3. Consequently, an adhering substance comprising an oligomer as a main component, which is formed, for example, by the reaction of acid and/or acid derivative with the adhesive component, attaches to the back of the semiconductor chip. The amount of the adhering substance becomes greater than that when the adhesive layer is completely cured, so that the adhesive strength between the back of the semiconductor chip and the sealant resin becomes greater via, for example, the acid and/or acid derivative contained in the adhering substance, whereby package crack is avoided. In addition, releasability of the semiconductor sealant resin from the molding die and adhesiveness between the resin and the respective semiconductor chips are improved to facilitate designing of the semiconductor sealant resin.

The suitable amount and time of the irradiation of radiation B are determined, for example, by estimating the relationship between the amount or time of irradiation of radiation, and the amount of the adhered particles from the adhesive sheet using a laser surface detection system, various microscopic observations and surface analyzing system such as ESCA, and determining the amount and time of irradiation at which the adhered amount is relatively great (maximum or minimum or the value in the vicinity thereof). What is to be considered when determining the suitable amount and time of irradiation of radiation B is to set them to the values that sufficiently lower the adhesive strength between the adhesive sheet 1 and the semiconductor chips A1 . . . , so that the adhesive will not stick to the back of the semiconductor chips A1 . . . , when picking up the semiconductor chips A1 . . . from the adhessive sheet 1. In the desirable state before complete curing, the peaks of double bond keep decreasing when determined by infrared absorption spectrum.

Figure 3:
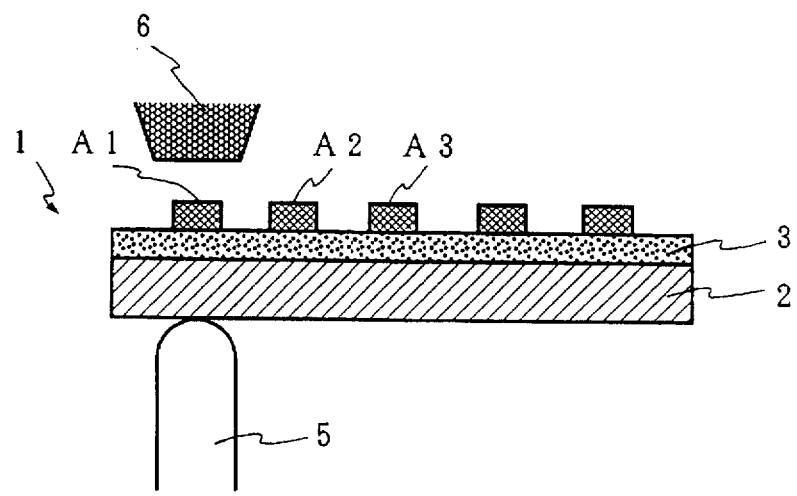
FIG. 3 explains a pick up step using the adhesive sheet for adhering a wafer, of the present invention.

Then, the adhesive sheet 1 is sent to a pick-up station not shown. As shown in FIG. 3, the semiconductor chips A1 . . . to be picked up are thrusted from the substrate 2 side with a thrusting rod 5. The thrusted semiconductor chips A1 . . . are picked up by, for example, an air pincette 6 and mounted on a predetermined substrate. The irradiation of radiation B may be performed at the pick-up station.

In the separation method of the present invention, the step for expanding the adhesive sheet 1 is not essential. The wafer A may be subjected to dicing, washing and drying, whereafter the adhesive sheet 1 is irradiated with radiation B and respective semiconductor chips A1 . . . thus cut may be picked up.

According to the method for producing the semiconductor element of the present invention, the adhesion between the lead frame and sealant resin, and/or the adhesion between the semiconductor chip and sealant resin are/is improved by the treatment of the lead frame and/or semiconductor chip (or semiconductor wafer) with the above-mentioned compound which is an adhesion-improving ingredient, and package cracks developed upon sealing the lead frame and semiconductor chip with a sealant resin can be eliminated. In addition, the need to cover the back of the semiconductor chip with an expensive polyimide resin is obviated, thus enabling reduction of production costs. Moreover, releasability of the semiconductor sealant resin from the molding die and adhesiveness between the resin and the semiconductor chips are improved, so that designing of the semiconductor sealant resin becomes easy. The adhesive sheet of the present invention can be suitably used for the production method of semiconductor elements of the present invention.

The present invention is explained in detail in the following by illustrative examples, to which the present invention is not limited. In the Examples, "%" means "% by weight" unless specifically indicated.

EXAMPLES 1–9 a. tensile release property

Figure 4:
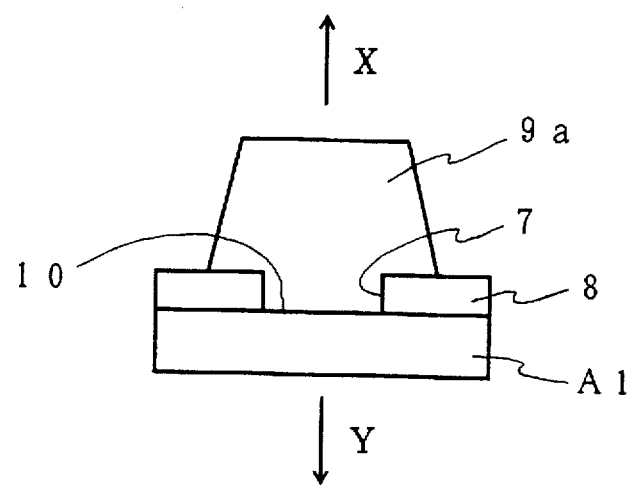
FIG. 4 explains a measurement method of the tensile release property of the chip.

A 5% toluene solution (0.1 ml) of the compound shown in Table 1 was portionwise dropped onto the back (the opposite surface from the pattern-formed surface) of a 7.5 mm square semiconductor chip, which was obtained by dicing a silicon wafer, and the chip was treated in a spin-coater at 800 rpm for 20 seconds to dryness. As shown in FIG. 4, a captone tape 8 having a 2 mm diameter opening 7 was adhered to the 7.5 mm square semiconductor chip A1, and a truncated cone mold 9a was formed using a semiconductor sealant resin (MP-190ML, manufactured by Nitto Denko Corporation) such that the mold contacts the back 10 of the semiconductor chip A1 at the opening 7, and the tape was drawn to the arrow (X, Y) directions at a peeling rate of 5 mm/min to determine the tensile release property of the respective chips. The results are also shown in Table 1.

b. Occurrence of package cracks

Comparative Example 1

In the same manner as in Examples except that the back of the semiconductor chip was washed with toluene instead of applying a toluene solution of the compound of Table 1, tensile release property and the occurrence of package cracks were examined, the results of which are shown in Table 1. The semiconductor element was released from the surface due to the interface between the back of the semiconductor chip and the sealant resin.

TABLE 1

| | Compound | tensile release | cracks |
|---|---|---|---|
| Ex. 1 | isocyanate compound *1 | 5310 g | none |
| Ex. 2 | melamine compound *2 | 4540 g | none |
| Ex. 3 | epoxy compound *3 | 4660 g | none |
| Ex. 4 | monoaminosilane compound *4 | 5420 g | none |
| Ex. 5 | isocyanate-silane compound *5 | 5200 g | none |
| Ex. 6 | phthalic anhydride | 4850 g | none |
| Ex. 7 | maleic anhydride | 4600 g | none |
| Ex. 8 | benzenesulfonic acid | 4720 g | none |
| Ex. 9 | diaminosiloxane *6 | 5230 g | none |
| Ex. 10 | 3-ureidopropyltriniethoxy silane | 5160 g | none |
| Ex. 11 | 3-4,5-dihydroimidazole propyltri-ethoxysilane | 5020 g | none |
| Ex. 12 | 2-(3,4-epoxycylohexyl)ethyl-triniethoxysilane | 4970 g | none |
| Ex. 13 | dimethoxy-diphenyl diisocyanate | 5230 g | none |
| Ex. 14 | [structure: $CH_2-CH-CH_2O-\text{phenyl}-C(CH_3)_2-\text{phenyl}-OCH_2-CH-CH_2$ with epoxide groups] | 4890 g | none |
| Ex. 15 | [structure with $CH_2O-C(=O)$ linking two cyclohexane rings with CH$_3$ groups and O] | 4570 g | none |
| Ex. 16 | ethanesulfonic acid | 4610 g | none |
| Co. Ex. 1 | none | 3740 g | partial |

Figure 5:
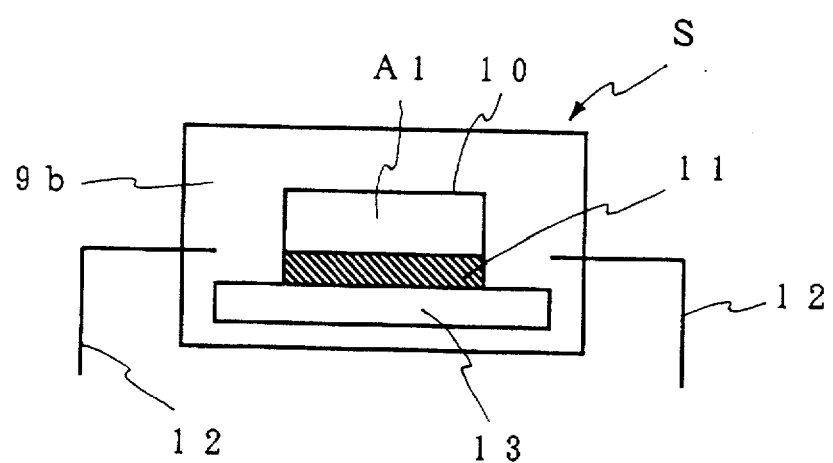
FIG. 5 explains the inside of the package.

*1:CORONATE L, manufactured by NIPPON POLYURETHANE INDUSTRY CO., LTD.
*2:SUPER BECKAMINE-820, manufactured by DAINIPPON INK AND CHEMICALS, INC.
*3:TETRAD-C, manufactured by Mitsubishi Gas Chemical Company, Inc.
*4:Silane coupling agent KBM-903, manufactured by Shin-Etsu Chemical Co., Ltd.
*5:Silane coupling agent KBP-44, manufactured by Shin-Etsu Chemical Co., Ltd.
*6:bis(3-aminopropyl)tetramethylene disiloxane A 5% toluene solution (0.1 ml) of the compound shown in Table 1 was portionwise dropped onto the back (the opposite surface from the pattern-formed surface) of a 7.5 mm square semiconductor chip which was obtained by dicing a silicon wafer, and the chip was treated in a spin-coater at 800 rpm for 20 seconds to dryness. As shown in FIG. 5, the semiconductor chip A1 was bonded to a die pad 13 connected with a lead frame 12, with a silver paste 11, such that the back 10 of the semiconductor chip came on the top, and a 80 pin-QFP package 9b was formed using a semiconductor sealant resin (MP-190ML, manufactured by Nitto Denko Corporation) to give a semiconductor element S. The element was stored at 85° C. under 85% RH for 72 hours and heated at 240° C. for 10 seconds by far infrared radiation. The semiconductor element S did not develop cracks due to the interface between the back 10 of the semiconductor chip A1 and the sealant resin (package) 9b, and good results were obtained.

EXAMPLES 17–20 a. Shear adhesion

Figure 6:
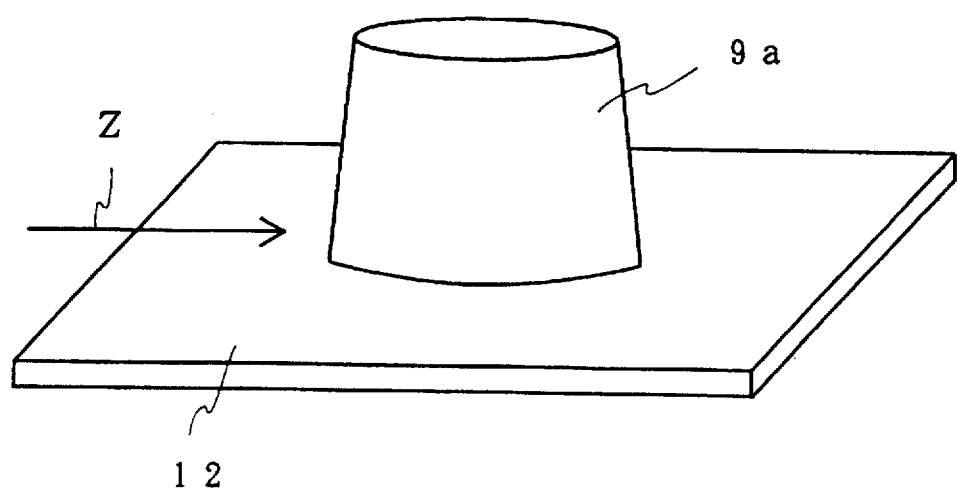
FIG. 6 explains a measurement method of the shear adhesion of a lead frame.

A copper lead frame (26 mm×35 mm×0.25 mm) washed with trichloroethane was immersed in a 0.5% toluene solution of the compound of Table 2, and immediately treated in a spin-coater at 800 rpm for 20 seconds to dryness. As shown in FIG. 6, a truncated cone mold 9a having a top face diameter of 3.8 mm, a base diameter of 4.4 mm and a height of 3 mm was formed with a semiconductor sealant resin (MP-190ML, manufactured by Nitto Denko Corporation) on a lead frame 12. The lead frame 12 was fixed with a measurement jig, and shear adhesion was measured upon application of the load in the direction of an arrow Z to the mold 9a at an autograph rate of 5 mm/min. The results are also shown in Table 2.

b. Occurrence of package cracks

A lead frame was immersed in a 5% toluene solution of the compound of Table 2 and immediately treated in a spin-coater at 800 rpm for 20 seconds to dryness. A semiconductor element was prepared using an 80 L-QFP (14 mm×20 mm×0.4 mm) for a package, a tub (8 mm×8 mm), a silicon chip of 8 mm square, a lead frame of 42 alloy (0.15 mm thickness) and a silver paste for die bond, and stored at 85° C. and under 85% RH for 72 hours and heated at 240° C. for 10 seconds by far infrared radiation. The semiconductor element did not develop cracks due to the interface between the lead frame and the sealant resin (package), and good results were obtained.

Comparative Example 2

In the same manner as in Examples except that the lead frame was washed with toluene instead of applying a toluene solution of the compound of Table 2, shear adhesion and the occurrence of package cracks were examined, the results of which are shown in Table 2. The semiconductor element partly developed cracks due to the interface between the lead frame and the sealant resin.

TABLE 2

| | Compound | Shear adhesion | Cracks |
|---|---|---|---|
| Ex. 17 | isocyanate compound*1 | 25.6 kg | none |
| Ex. 18 | isocyanate-silane compound*5 | 24.7 kg | none |
| Ex. 19 | phthalic anhydride | 23.1 kg | none |
| Ex. 20 | maleic anhydride | 22.5 kg | none |
| Co. Ex. 2 | none | 10.7 kg | partial |

*1 and *5 are as in Table 1.

EXAMPLES 21–23

Comparative Example 3

The following adhesives a to d were coated on 50 μm thick polyester films to give adhesive sheets for adhering wafer, which sheets having a 20 μm thick adhesive layer. In the adhesive formulations below, "part" means "part by weight".

EXAMPLE 21

| Adhesive a: | acrylic adhesive | 100 parts |
|---|---|---|
| | urethane acrylate | 30 parts |
| | photopolymerization initiator | 3 parts |
| | silane coupling agent (commercial name: KBP-44, manufactured by Shin-Etsu Chemical Co., Ltd.) | 2 parts |

EXAMPLE 22

| Adhesive b: | acrylic adhesive | 100 parts |
|---|---|---|
| | urethane acrylate | 30 parts |
| | photopolymerization initiator | 3 parts |
| | silane coupling agent (commercial name: KBP-44, manufactured by Shin-Etsu Chemical Co., Ltd.) | 0.5 part |

EXAMPLE 23

| Adhesive c: | acrylic adhesive | 100 parts |
|---|---|---|
| | urethane acrylate | 30 parts |
| | bis(3-aminopropyl)tetramethylenedisiloxane | 1 part |

Comparative Example 3

| Adhesive d: | acrylic adhesive | 100 parts |
|---|---|---|
| | urethane acrylate | 30 parts |
| | photopolymerization initiator | 3 parts |

90°-Release adhesive strength

The adhesive sheets of Examples 21–23 and Comparative Example 3 were irradiated with UV (46 mJ/cm$^2$·s) for 10 seconds from the substrate side, using an air-cooled high-pressure mercury lamp, and the above-mentioned 90°-release adhesive strength was measured. The result was 19 g/25 mm for Examples 21–23 and 18 g/25 mm for Comparative Example 3.

Separation of semiconductor chip

Silicon wafers were respectively adhered to the adhesive sheets of Examples 21–23 and Comparative Example 3, and the obtained sheets were fully cut into 5 mm×5 mm silicon chips. After dicing, the respective adhesive sheets were irradiated with UV (46 mJ/cm$^2$·s) for 7 seconds from the substrate side, using an air-cooled high-pressure mercury lamp, and silicon chips were picked up. The tensile release property of these chips from the semiconductor sealant resin was measured as in the following, the results of which are summarized in Table 3.

Tensile release property of chip

As shown in FIG. 4, a captone tape 8 having a 2 mm diameter opening 7 was adhered to a 5 mm square silicon chip A1, and a mold 9a was formed using a semiconductor sealant resin (MP-190ML, manufactured by Nitto Denko Corporation) such that the mold contacted the silicon chip A1 at the opening 7, and the tape was drawn to the arrow (X, Y) directions at a peeling rate of 5 mm/min to determine the tensile release strength. The adhesive sheet was adhered to the back of the wafer, and a semiconductor sealant resin layer (mold) 9a was formed on the back 10 of the diced silicon chip A1.

TABLE 3

| | Ex. 21 | Ex. 22 | Ex. 23 | Com. Ex. 3 |
|---|---|---|---|---|
| Tensile release strength | 5200 g | 4360 g | 4850 g | 2570 g |

Occurrence of package cracks

Using the adhesive sheets of Examples 21–23 and Comparative Example 3, silicon wafers were diced into 7.5 mm square, and the silicon chips A1 were separated from the respective adhesive sheets. As shown in FIG. 5, the chip A1 was bonded to a die pad 13 connected with a lead frame 12, with a silver paste 11, such that the back 10 of the silicon chip came on the top, and a package 9b of QFP-80 was formed using a semiconductor sealant resin (MP-190ML, manufactured by Nitto Denko Corporation). The chip was stored at 85° C. and under 85% RH for 72 hours and heated at 240° C. for 10 seconds by far infrared radiation.

As a result, the semiconductor package of the chip A1 separated from the adhesive sheet of Examples 21–23 did not develop cracks due to the interface between the back of the chip and the sealant resin, whereas the surface came off from the chip of Comparative Example 3, thus failing to achieve good results.

Production of adhesive sheet for adhering wafer

EXAMPLES 24–31

Comparative Example 4

The following adhesives e to m were coated on 50 μm thick polyester films to give adhesive sheets for adhering wafer, which sheets having a 20 μm thick adhesive layer. In the adhesive formulations below, "part" means "part by weight".

EXAMPLE 24

| Adhesive e: | acrylic adhesive | 100 parts |
| | dipentaerythritol hexaacrylate | 30 parts |
| | photopolymerization initiator | 3 parts |

EXAMPLE 25

| Adhesive f: | acrylic adhesive | 100 parts |
| | dipentaerythritol hexaacrylate | 30 parts |
| | photopolymerization initiator | 3 parts |
| | phthalic anhydride | 1 part |

EXAMPLE 26

| Adhesive g: | acrylic adhesive | 100 parts |
| | urethane acrylate | 30 parts |
| | photopolymerization initiator | 3 parts |
| | maleic anhydride | 1 part |

EXAMPLE 27

| Adhesive h: | acrylic adhesive | 100 parts |
| | urethane acrylate | 30 parts |
| | photopolymerization initiator | 3 parts |
| | phthalic anhydride | 1 part |

EXAMPLE 28

| Adhesive i: | acrylic adhesive | 100 parts |
| | urethane acrylate | 30 parts |
| | photopolymerization initiator | 3 parts |
| | phosphoric acid | 1 part |

EXAMPLE 29

| Adhesive j: | acrylic adhesive | 100 parts |
| | tetramethylolmethane triacrylate | 30 parts |
| | photopolymerization initiator | 3 parts |

EXAMPLE 30

| Adhesive k: | acrylic adhesive | 100 parts |
| | urethane acrylate | 30 parts |
| | silane coupling agent (KBP-44) | 2 parts |
| | photopolymerization initiator | 3 parts |

EXAMPLE 31

Comparative Example 4

| Adhesive l: | acrylic adhesive | 100 parts |
| | urethane acrylate | 30 parts |
| | silane coupling agent (KBM-903) | 2 parts |
| | photopolymerization initiator | 3 parts |

Comparative Example 4

| Adhesive m: | acrylic adhesive | 100 parts |
| | urethane acrylate | 30 parts |
| | photopolymerization initiator | 3 parts |

Prior to separating the semiconductor chips from these adhesive sheets, the following tests were done with regard to the adhesive sheet of Example 24 using an adhesive e, to determine the time of UV irradiation onto the adhesive layer of the adhesive sheet.

Figure 7:
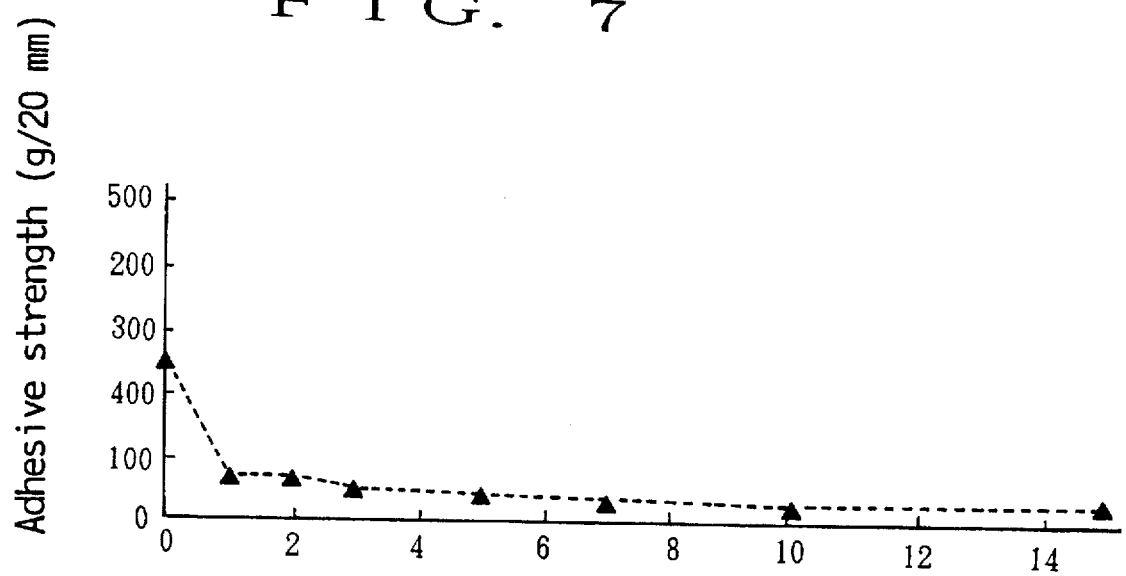
FIG. 7 is a graph showing the time-course changes in adhesion between an adhesive sheet and a wafer, which are caused by UV irradiation.

(1) Time-course changes in adhesion between adhesive sheet and wafer due to UV irradiation A 20 mm wide, 100 mm long adhesive sheet strip was adhered to the back (the opposite surface from the pattern-formed surface) of a wafer, and changes in adhesion of wafer, when UV irradiation time was altered, were examined. Thirty minutes after the adhesion, the adhesive sheet was irradiated with UV (46 mJ/cm$^2$·s) using an air-cooled high-pressure mercury lamp, and adhesion was examined at 23° C. and under 55% RH, release rate 300 mm/min and release angle 90°, the results of which are shown in FIG. 7. It is known from the graph of FIG. 7 that about 1 second or more of UV irradiation is necessary for the UV curing to proceed.

(2) Time-course changes in particle numbers by UV irradiation

Figure 8:
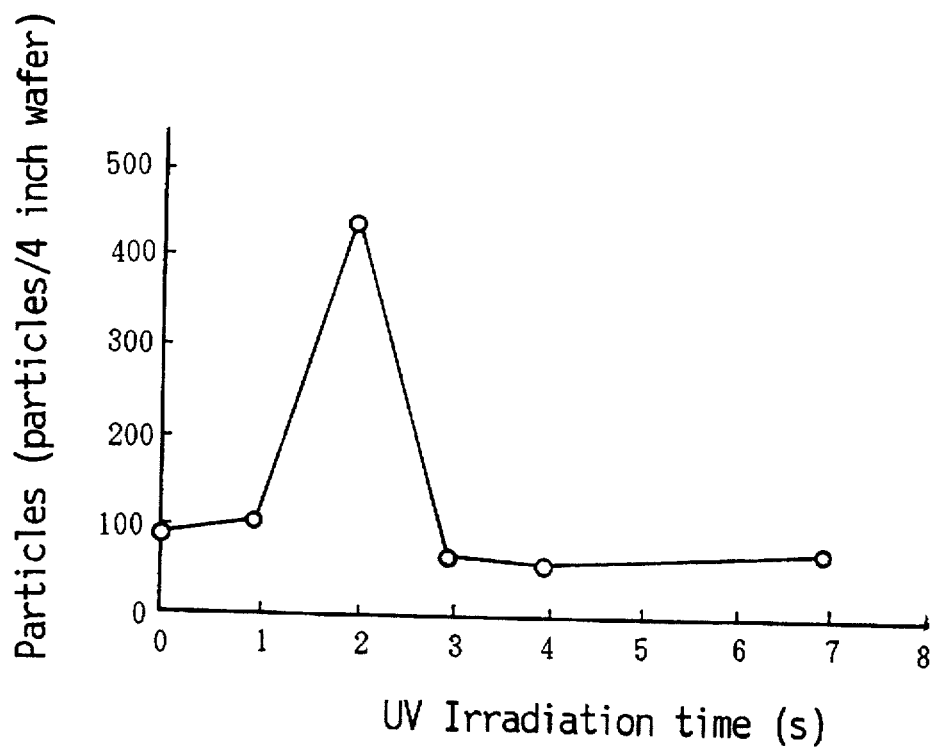
FIG. 8 is a graph showing the time-course changes in particle numbers, which are caused by UV irradiation.

The adhesive sheet of the present invention was adhered to the back (opposite surface from the pattern-formed surface) of a 4 inch wafer, and 30 minutes later, it was irradiated with UV (46 mJ/cm$^2$·s). Then, the adhesive sheet was peeled off, and the number of the particles (adhered substance comprising an oligomer as a main component) of 0.28 μm or more in size which were formed on the back thereof was counted using a laser surface detection system. The results obtained with varied UV irradiation time are shown in FIG. 8. The number of particles was found, from the graph of FIG. 8, to reach maximum when UV irradiation was continued for 2 seconds. For complete curing of the adhesive in the adhesive sheet of the present invention, a UV irradiation for about 7 seconds is generally necesssary. Accordingly, a UV irradiation for 2 seconds results in residual, unreacted adhesive component (dipentaerythritol hexaacrylate etc.) or an oligomer formed by the reaction of adhesive components, in the adhesive layer.

From the above-mentioned test results of time-course changes in adhesion of wafer and particle numbers, due to UV irradiation, the UV irradiation time is desirably 2 seconds for the adhesive sheet of Example 24 using the adhesive e. Since the composition of the adhesive f is almost the same as that of the adhesive e, the UV irradiation time is found to be desirably 2 seconds.

In the same manner as above, an optimal UV irradiation time for the adhesive g was determined and found to be 7 seconds. Since the compositions of the adhesives h, i and m are almost the same as that of the adhesive g, the UV irradiation time is found to be desirably 7 seconds.

Separation of semiconductor chip

Silicon wafers were respectively adhered to the adhesive sheets of Examples 24–31 and Comparative Example 4, and fully cut into 5 mm×5 mm silicon chips. After dicing, the adhesive sheets were irradiated with UV for 2 seconds (Examples 24, 25, 29–31) or 7 seconds (Examples 26–28, Comparative Example 4) from the substrate side, using an air-cooled high-pressure mercury lamp (46 mJ/cm$^2$·s), and silicon chips were picked up. The tensile release property of these chips from the semiconductor sealant resin was measured as in the following, the results of which are summarized in Table 4.

As shown in FIG. 4, a captone tape 8 having a 2 mm diameter opening 7 was adhered to a 5 mm square silicon chip A1, and a mold 9a was formed with a semiconductor sealant resin (MP-190ML, manufactured by Nitto Denko Corporation) such that the mold contacted the silicon chip A1 at the opening 7, and the tensile release property was measured at a peeling rate of 5 mm/min. The adhesive sheets were adhered to the back of the wafer, and a semiconductor sealant resin layer (mold) 9a was formed on the back 10 of the diced silicon chip A1.

TABLE 4

| Ex. 24 | Ex. 25 | Ex. 26 | Ex. 27 | Ex. 28 |
| --- | --- | --- | --- | --- |
| 6500 g | 5210 g | 4600 g | 4330 g | 4250 g |

| Ex. 29 | Ex. 30 | Ex. 31 | Com. Ex. 4 |
| --- | --- | --- | --- |
| 5560 g | 5200 g | 5460 g | 2570 g |

Occurrence of package cracks

Using the adhesive sheets of Examples 24–31 and Comparative Example 4, silicon wafers were diced into 7.5 mm square pieces, and silicon chips A1 were separated from the respective adhesive sheets. As shown in FIG. 5, the silicon chip A1 was bonded to a die pad 13 connected with a lead frame 12, with a silver paste 11, such that the back 10 of the silicon chip came on the top, and a package 9b of QFP-80 was formed using a semiconductor sealant resin (MP-190ML, manufactured by Nitto Denko Corporation). The package was stored at 85° C. and under 85% RH for 72 hours and heated at 240° C. for 10 seconds by far infrared radiation.

As a result, the semiconductor package of the chip A1 separated from the adhesive sheets of Examples 24–31 did not develop cracks due to the contact between the back of the chip and the sealant resin, whereas the release of the surface was observed in the sheet of Comparative Example 4, thus failing to afford good results.

While the present invention has been adequately and fully described by the foregoing specification and examples, it is to be understood that the present invention is subject to modification and change without departing from the spirit and scope of the invention.

What is claimed is:

1. A production method for producing a semiconductor element, comprising treating a lead frame or a semiconductor wafer or a semiconductor chip or a lead frame and a semiconductor chip in combination, with at least one package crack-preventing compound, wherein the treatment with the package crack-preventing compound is a transfer by placing a wafer on a pressure sensitive adhesive layer of an adhesive sheet for adhering a wafer, which layer comprises an adhesive layer comprising the at least one package crack-preventing compound selected from the group consisting of compounds having a reactive group (except the following acids and the derivatives at a group due to which said acid assumes acidity), acids, acid derivatives (except those encompassed in the compounds of the formula (I) from among the acids and acid derivatives), siloxane derivatives of the formula (I)

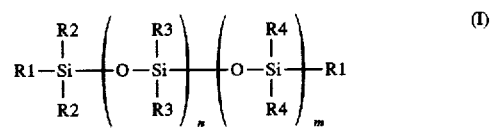

wherein R1, R2, R3 and R4 are the same or different and each is a monovalent organic group, n and m are each an integer of 0 or not less than 1, and the total of n and m is 1–1,000, and compounds having a number average molecular weight of not more than 10,000 and comprising, in their structure, said siloxane derivative residue, the sheet being laminated on a substrate.

2. The production method of claim 1, wherein the adhesive is a radiation curable adhesive.

3. The production method of claim 2, comprising placing a wafer on a pressure sensitive adhesive sheet for adhering a wafer, wherein a radiation curable adhesive is laminated on a substrate, cutting said wafer to give plural semiconductor chips, irradiating said adhesive layer with radiation to cure the adhesive layer and separating the semiconductor chip thus cut, which is characterized in that the irradiation of the radiation is completed before the adhesive completely cures.

4. The production method of claim 3, comprising sealing the semiconductor chip with a semiconductor sealant resin.

5. A pressure sensitive adhesive sheet for adhering a wafer, wherein an adhesive layer comprising a package-crack preventing compound selected from the group consisting of compounds having a reactive group (except acids and derivatives thereof at a group due to which said acid assumes acidity), acids, acid derivatives, which excludes, from among the acids and acid derivatives, those encompassed in the compounds of the formula (I), siloxane derivatives of the formula (I)

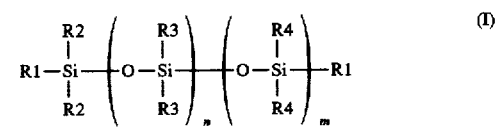

wherein R1, R2, R3 and R4 are the same or different and each is a monovalent organic group, n and m are each an integer of 0 or not less than 1, and the total of n and m is 1–1,000, and compounds having a number average molecular weight of not more than 10,000 and comprising, in their structure, said siloxane derivative, is laminated on a substrate.

6. The sheet of claim 5, wherein a 90°-release adhesive strength between the adhesive layer and the wafer placed on the adhesive layer is not more than 300 g/25 mm.

* * * * *

UNITED STATES PATENT AND TRADEMARK OFFICE
CERTIFICATE OF CORRECTION

PATENT NO. : 5,759,874
DATED : June 2, 1998
INVENTOR(S) : Yuji OKAWA

It is certified that error appears in the above-identified patent and that said Letters Patent is hereby corrected as shown below:

Claim 1, columns 19 and 20,

1. A production method for producing a semiconductor element, comprising treating (i) a lead frame or (ii) a semiconductor wafer or (iii) a semiconductor chip or (iv) a lead frame and a semiconductor chip in combination, with at least one package crack-preventing compound, wherein the treatment with the package crack-preventing compound is a transfer by placing a wafer on a pressure sensitive adhesive layer of an adhesive sheet for adhering a wafer, which layer comprises an adhesive layer comprising the at least one package crack-preventing compound selected from the group consisting of
  (A) compounds having a reactive group [(except the following acids and derivatives at a group due to which said acid assumes acidity)],
  (B) acids,
  (C) acid derivatives [(except those encompassed in the compounds of the formula (I) from among the acids and acid derivatives)],
  (D) siloxane derivatives of [the] formula (I)

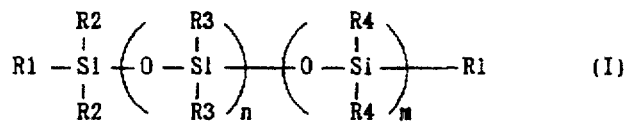

wherein R1, R2, R3 and R4 are the same or different and each is a monovalent organic group, n and m are each an integer of 0 or not less than 1, and the total of n and m is 1-1,000, and
  (E) compounds having a number average molecular weight of not more than 10,000 and comprising, in their structure, said siloxane derivative residue of formula (I), the sheet being laminated on a substrate.

Claim 5, Column 20:

UNITED STATES PATENT AND TRADEMARK OFFICE
CERTIFICATE OF CORRECTION

PATENT NO. : 5,759,874
DATED : June 2, 1998
INVENTOR(S) : Yuji OKAWA

It is certified that error appears in the above-identified patent and that said Letters Patent is hereby corrected as shown below:

5. A pressure sensitive adhesive sheet for adhering a wafer, wherein an adhesive layer comprising a package-crack preventing compound selected from the group consisting of (A) compounds having a reactive group [(except acids and derivatives thereof at a group due to which said acid assumes acidity)], (B) acids, (C) acid derivatives, [which excludes, from among the acids and acid derivatives, those encompassed in the compounds of the formula (I),]

(D) siloxane derivatives of [the] formula (I)

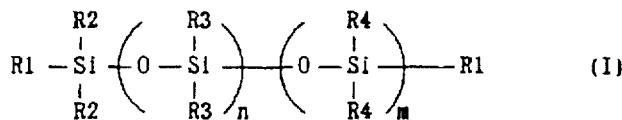

wherein R1, R2, R3 and R4 are the same or different and each is a monovalent organic group, n and m are each an integer of 0 or not less than 1, and the total of n and m is 1-1,000, and compounds having a number average molecular weight of not more than 10,000 and comprising, in their structure, said formula (I) siloxane derivative, is laminated on a substrate.

Signed and Sealed this

Fourteenth Day of December, 1999

Attest:

Attesting Officer

Q. TODD DICKINSON

Acting Commissioner of Patents and Trademarks